US007129716B2

(12) United States Patent
Schroeder

(10) Patent No.: US 7,129,716 B2
(45) Date of Patent: Oct. 31, 2006

(54) CIRCUIT FOR MOTOR VEHICLES WITH CODING PLUG

(75) Inventor: Jochen Schroeder, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 11/336,932

(22) Filed: Jan. 23, 2006

(65) Prior Publication Data

US 2006/0119370 A1 Jun. 8, 2006

Related U.S. Application Data

(63) Continuation of application No. PCT/EP04/08147, filed on Jul. 20, 2004.

(30) Foreign Application Priority Data

Jul. 24, 2003 (DE) ................................ 103 33 651

(51) Int. Cl.
*G01R 27/08* (2006.01)
*G06F 7/00* (2006.01)
*H01R 27/02* (2006.01)

(52) U.S. Cl. ......................... 324/691; 701/59; 439/638

(58) Field of Classification Search ................ 324/691, 324/649, 600, 538; 701/600, 59, 58, 51, 701/36; 439/638
See application file for complete search history.

(56) References Cited

U.S. PATENT DOCUMENTS 4,267,569 A * 5/1981 Baumann et al. ............. 701/99
4,331,122 A * 5/1982 Sohner et al. .............. 123/595
4,972,293 A 11/1990 Verner
5,003,476 A * 3/1991 Abe ............................ 701/33
5,278,547 A * 1/1994 Suman et al. .............. 340/5.22
6,605,948 B1 * 8/2003 Russell ........................ 324/538
6,671,614 B1 * 12/2003 Weisman et al. ........... 701/115
6,789,003 B1 * 9/2004 Magner et al. ................ 701/2

FOREIGN PATENT DOCUMENTS

| | | | |
|---|---|---|---|
| DE | 2133062 | | 2/1972 |
| DE | 3609850 | C1 * | 9/1987 |
| DE | 4326327 | A1 | 9/1994 |
| DE | 19722115 | A1 | 12/1998 |
| DE | 19820691 | A1 | 2/1999 |
| DE | 10061025 | A1 | 6/2002 |
| EP | 0437697 | A2 | 7/1991 |

OTHER PUBLICATIONS

International Search Report for PCT/EP2004/008147 dated Sep. 22, 2004.
German Examination Report for 103 33 651.6-34 dated Apr. 6, 2005.

* cited by examiner

*Primary Examiner*—Anjan Deb
*Assistant Examiner*—Hoai-An D. Nguyen
(74) *Attorney, Agent, or Firm*—Crowell & Moring LLP

(57) ABSTRACT

A circuit arrangement for motor vehicles for characterizing one of several variants of an electrically controllable subassembly is provided. A subassembly is connectable to a coding plug. The coding plug has at least one electric terminal which is directly or indirectly connectable to a measurement input of an analyzer unit. The coding plug has fixed electric wiring by means of which a defined electric state may be generated at the measurement input in the analyzer unit. The electric state is detected in the analyzer unit and compared with stored data, by means of which a defined electric state that can be differentiated from all other states is assigned to each possible variant of the subassembly.

11 Claims, 3 Drawing Sheets

CIRCUIT FOR MOTOR VEHICLES WITH CODING PLUG

The present application is a continuation of International Patent Application No. PCT/EP2004/008147, filed Jul. 20, 2004, and claims priority under 35 U.S.C. § 119 to German Application No. DE 10333651.6-34, filed Jul. 24, 2003. The entire disclosure of these applications are herein expressly incorporated by reference.

BACKGROUND AND SUMMARY OF THE INVENTION

German Patent Document Nos. DE 100 61 025 A1 or DE 21 33 062A1 disclose circuit arrangements for motor vehicles. In these circuits different resistances, which vary according to the switch setting, can be applied to the measurement input of an analyzer circuit via manually operated switches in an operating unit. This yields a manually operated characterization of one of several functions that can be requested.

The object of the present invention is to create a simple and inexpensive circuit arrangement for motor vehicles for characterizing one of several variants of an electrically controllable subassembly.

This object is achieved through a system for a motor vehicle for characterizing one of multiple variants of an electrically controllable subassembly, the system comprising: a coding plug connectable to the subassembly; and an analyzer unit with a measurement input connectable directly or indirectly to at least one electric terminal of the coding plug, wherein the coding plug has a fixed electric wiring arranged such that a defined electric state is generable at the measurement input of the analyzer unit, and wherein the electric state is detected by the analyzer unit and compared with stored data such that a defined electric state differentiable from all other states is assigned to each possible variant of the subassembly.

Through the present invention a control unit for controlling the subassembly can still be manufactured, supplied and installed, independently of the subassembly. No additional logistical effort and/or expense is required for different variants of a subassembly. The variant is “learned” by the analyzer unit, which can be integrated into the control unit for controlling the subassembly. After recognition of the variant in the analyzer unit and/or in the control unit, mechanical tolerances can be compensated through the control technology. This allows savings in design measures for reducing tolerances. A simple analysis is performed in the analyzer unit and/or in the control unit. In customer service, simple handling is also possible when exchanging a subassembly. The new variant can be learned anew.

BRIEF DESCRIPTION OF THE DRAWINGS

The drawing illustrates an exemplary embodiment of the present invention.

DETAILED DESCRIPTION

Figure 1:
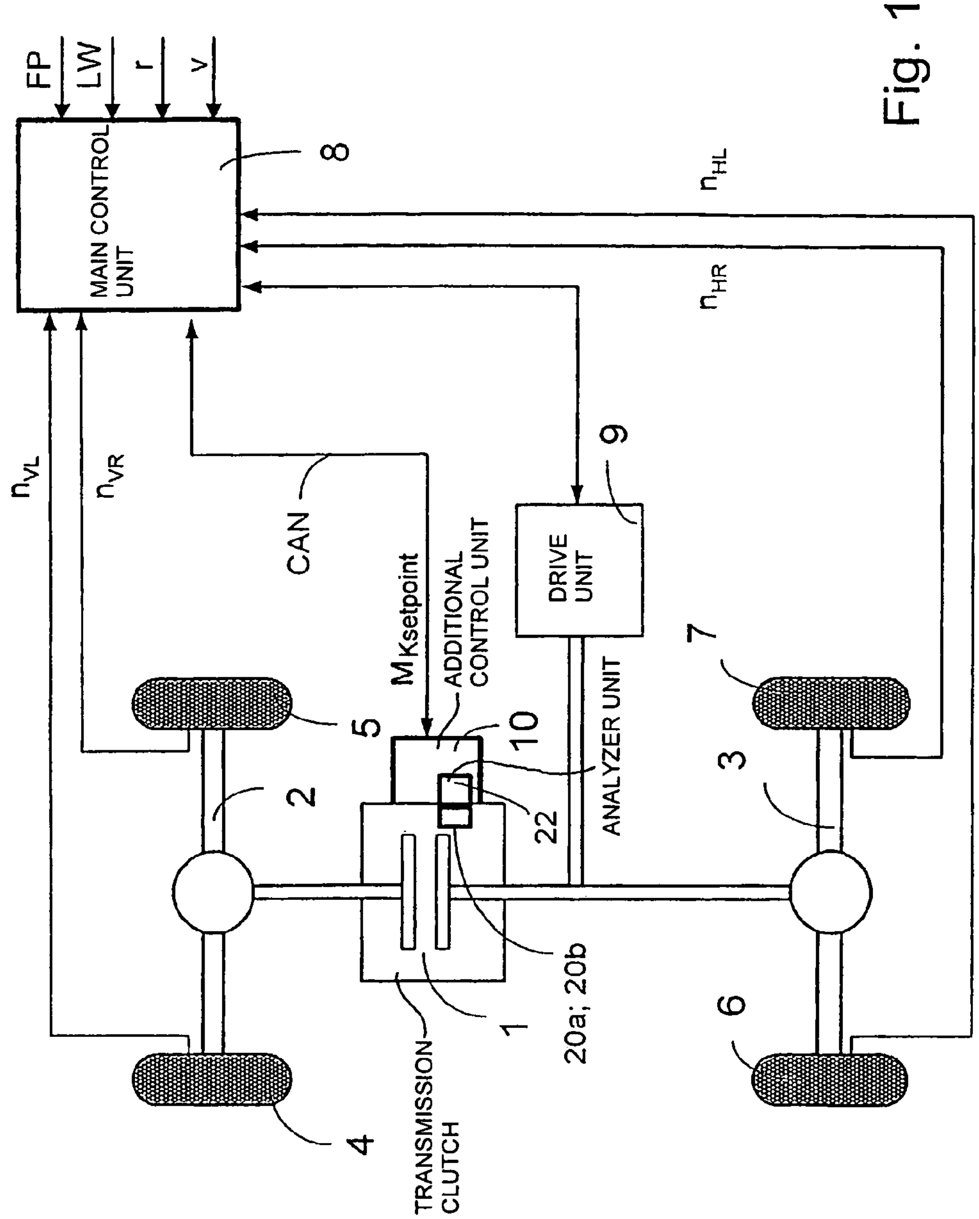
FIG. 1 illustrates an exemplary application of the circuit arrangement in motor vehicles having a variable-speed four-wheel drive in accordance with the present invention.

FIG. 1 illustrates an exemplary application of the inventive circuit arrangement in a control device for a motor vehicle that has four-wheel drive for at least some of the time, having an electronic control unit by means of which the drive torque of a drive unit is variably distributable to primary driving wheels, which are permanently connected to the drive unit, and to secondary driving wheels, which can be connected to the drive unit via a transmission clutch as needed. In doing so, the control unit determines a setpoint clutch torque which is to be set by an actuator device on the transmission clutch. The control unit contains the analyzer unit, and the actuator device for the transmission clutch is an example of an electrically controllable subassembly.

The detail in FIG. 1 shows a vehicle in the form of a motor vehicle, which basically has rear-wheel drive but may be converted temporarily to a four-wheel drive and has front-wheel drive that can be activated as needed via a transmission clutch 1. The transmission clutch 1 is adjustable via a control unit comprised of a main control unit 8 and an additional control unit 10. The additional control unit 10 is separated spatially from the main control unit 8 and is situated in the vicinity of the transmission clutch 1. It will be recognized that the control unit need not consist of two control subunits.

In a vehicle, the total torque (drive torque) of the drive unit 9 is transmitted to the wheels 6 and 7 of the rear axle 3 when the transmission clutch 1 is disengaged. The drive unit 9 comprises an internal combustion engine, a transmission and at least one drive controller (not shown in greater detail here). The drive controller also communicates with the main control unit 8 and the additional control unit 10 via the known data bus CAN, for example. FIG. 1 shows the rear wheels 6 and 7 as the primary driving wheels because they are permanently connected to the drive unit 9. With an increase in clutch torque on the transmission clutch 1, the drive unit 9 also drives the wheels 4 and 5 of the front axle 2. The front wheels 4 and 5 are thus the secondary driving wheels.

The main control unit 8, which can be part of an electronic driving dynamics controller (e.g., DSC, i.e., dynamic stability control, from BMW), calculates a setpoint clutch torque $M_{Ksetpoint}$ as a function of parameters detected and/or determined in the controller. The main control unit 8 detects or determines, for example, the accelerator pedal position FP, the steering angle LW, the yaw rate, i.e., the yaw angular velocity r, the wheel rotational speeds $n_{VL}$, $n_{HL}$, $n_{VR}$, $n_{HR}$ of all the wheels 4, 5, 6, 7 and the vehicle speed v as parameters for determining the setpoint clutch torque $M_{Ksetpoint}$. The setpoint clutch torque $M_{Ksetpoint}$ is relayed to the additional control unit 10 via the known vehicle data bus CAN.

The additional control unit 10 converts the setpoint clutch torque $M_{Ksetpoint}$ into a corresponding electric triggering signal for the actuator device of the transmission clutch 1. An analyzer unit 22 can be included in the additional control unit 10. Details of the analyzer unit 22 and the two alternative coding plugs 20*a* and/or 20*b*, which are in turn directly or indirectly connectable to the actuator device and to the analyzer unit 22 and/or to the additional control unit 10, are described in conjunction with FIG. 2 and FIG. 3.

Figure 4A:
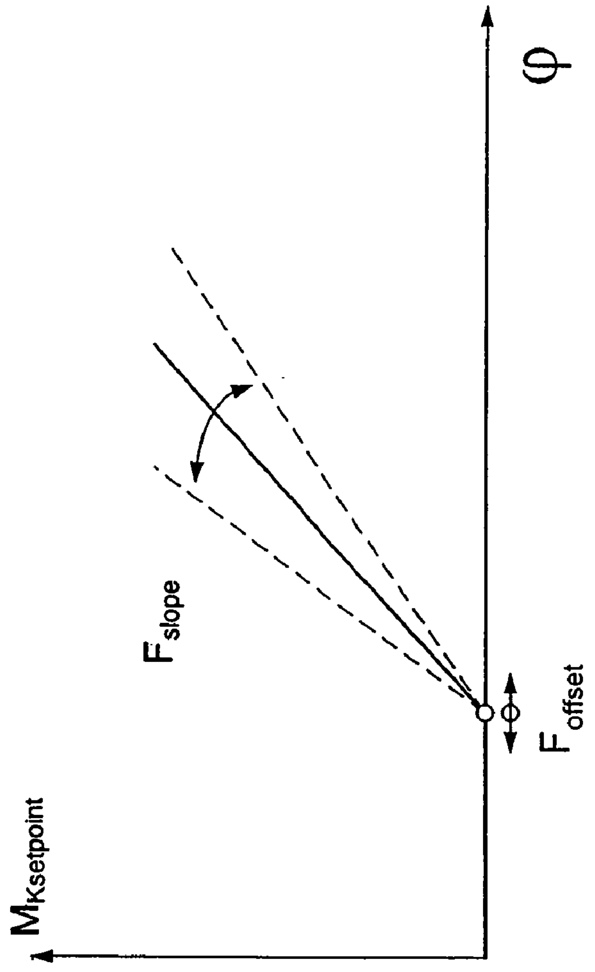
FIG. 4*a* and FIG. 4*b* illustrates an example of how different variants of an electrically controllable subassembly come about in the form of an actuator device for a variable-speed four-wheel drive.
Figure 4B:
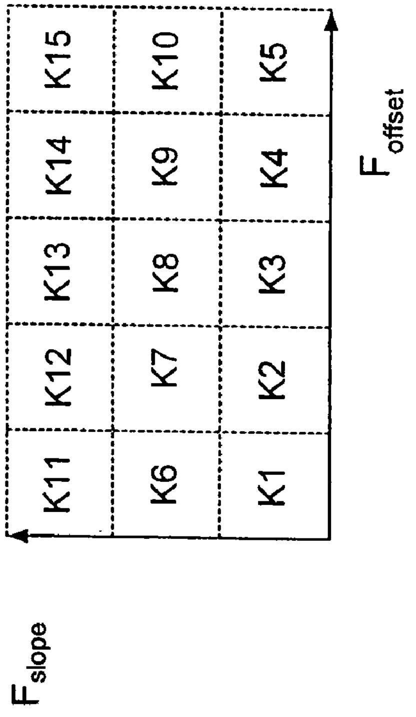

The actuator device here is an example of an electrically controllable subassembly. The actuator device includes, for example, an electric motor, which moves a worm gear for engaging and disengaging the transmission clutch 1. A high measure of accuracy is required in controlling the actuator device because the actual setpoint clutch torque $M_{Ksetpoint}$ is not detected. This not a monitoring type of regulating, but instead involves control of the actuator device. Because actuator devices are known to have high tolerances, a classification of actuator devices is necessary. For the actual setting of a setpoint clutch torque $M_{Ksetpoint}$, different setting angles N may be necessary as a function of tolerances. These problems are illustrated in FIG. 4*a*. This results in offset errors $F_{offset}$ and slope errors $F_{slope}$. In FIG. 4*b*, a classification, i.e., here a division into fifteen classes K1 through K15, is implemented as a function of the distribution of the offset errors $F_{offset}$ and the slope errors $F_{slope}$. The different classes correspond to the possible variants of the actuator device.

Figure 2:
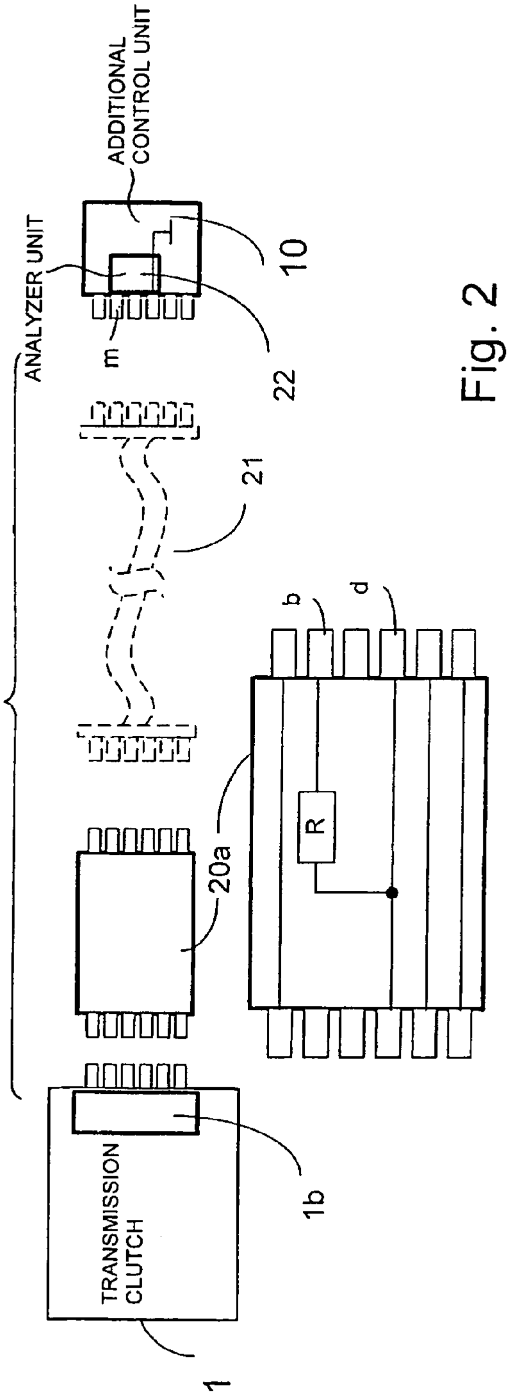
FIG. 2 illustrates a first embodiment of the circuit arrangement in accordance with the present invention.
Figure 3:
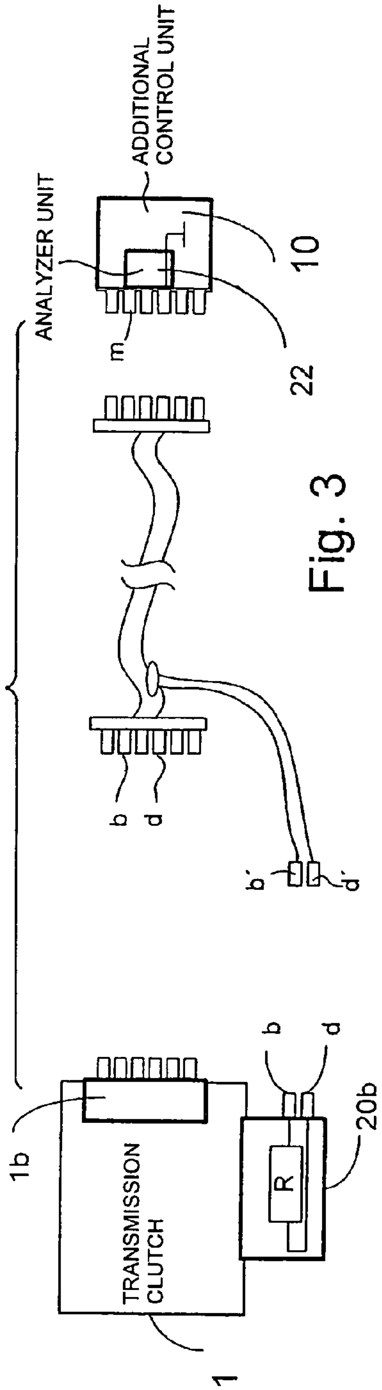
FIG. 3 illustrates a second embodiment of the circuit arrangement in accordance with the present invention.

FIGS. 2 and 3 illustrate in greater detail a first exemplary embodiment and a second exemplary embodiment of the inventive circuit arrangement for motor vehicles for characterizing one of several variants of an electrically controllable subassembly in the form of the aforementioned actuator device 1*b* for the transmission clutch 1.

FIG. 2 illustrates that the actuator device 1*b* that can be connected to a coding plug 20*a* via the six electric terminals shown as an example. The coding plug 20*a* has at least one electric terminal b which is connectable to a measurement input m of the analyzer unit 22 either directly or indirectly via a cable or cable tree 21. The analyzer unit 22 can be integrated into the additional control unit 10, i.e., within an electronic control unit for controlling the subassembly. In the specific example according to FIG. 2, the coding plug 20*a* is an adapter plug between the electric terminals of the actuator device 1*b* and the electric terminals of the analyzer unit 22 and/or the additional control unit 10. The coding plug 20*a* may also be an adapter plug between the electric terminals of the actuator device 1*b* and the terminals of a cable tree 21 (the cable tree 21 is therefore shown with dotted lines), which is in turn connectable to the analyzer unit 22 and/or the additional control unit 10. The term adapter plug is understood to refer to a plug having electric terminals at the input end and at the output end. The number of electric terminals of the actuator device 1*b* can equal to the number of electric terminals (on both the input and output ends) of the coding plug 20*a* and the number of electric terminals of the coding plug 20*a* (at both the input end and the output end) may be equal to the number of electric terminals of the analyzer unit 22 and/or the additional control unit 10. A cable tree 21 optionally provided between the coding plug 20*a* and the analyzer unit 22 and/or the additional control unit 10 also has the same number of electric terminals at the input and output ends as the coding plug 20*a* and the analyzer unit 22 and/or the additional control unit 10.

FIG. 3 shows a circuit arrangement in which an additional plug 20*b* is used as a coding plug which is attached by a mechanical connection to the actuator device 1*b* (e.g., by screw connection of the housing of the additional plug to the housing of the subassembly) instead of an adapter plug which is electrically connectable to the actuator device 1*b*. Such an additional plug 20*b* has at least one electric terminal b on one side, which is connectable directly or indirectly via a cable or a cable tree 21 to the electric terminal of the analyzer unit 22 assigned to the measurement input m. A cable tree 21 is preferably arranged between the electric terminals of the actuator device 1*b* and the electric terminals of the analyzer unit 22 and/or the additional control unit 10, so that at least the cable assigned to the measurement input m with the terminal b' branches off from this cable tree.

The coding plug 20*a* or 20*b* according to FIG. 2 or FIG. 3 has fixed electric wiring by which a defined electric state can be generated at the measurement input m in the analyzer unit 22.

Therefore, an ohmic resistor R having a defined value (which may also be zero or an infinitely large value) may be connected to the terminal b of the coding plug 20*a* or 20*b*, which is in turn directly or indirectly connectable to the terminal m of the analyzer unit 22 and/or the additional control unit 10; this resistor may be wired to "ground" (see wiring of terminal d) or to the positive pole (not shown here), depending on the wiring of the measurement input. The electric wiring with the ohmic resistor R is at any rate such that a corresponding electric state can be detected at the measurement input m of the analyzer circuit according to the value of the resistor. In the case of the coding plug 20*a*, as the adapter plug as well as in the case of the coding plug 20*b* as the additional plug, the defined resistance R is preferably connectable to the terminal b (which is connectable to the measurement input m of the analyzer unit 22), and to the terminal d (which is directly or indirectly connectable to ground or to the positive pole in the analyzer unit 22 and/or the additional control unit 10).

Each possible variant (e.g., classes K1 through K15) of the actuator device 1*b* is assigned, for example, a resistance value that can be differentiated from all other resistance values. By means of data stored in the analyzer unit 22, a defined electric state that is differentiable from all other states, e.g., according to the selected differentiable resistance values, is assigned to each possible variant of the actuator unit 1*b*.

An electric state is either defined by a voltage value, for example, or a combination of a current value and a voltage value. This invention also includes, for example, electric circuits such as a short circuit (corresponding to a resistor having a value of zero) of the terminal b to ground, a short circuit of terminal b to the positive pole and open terminal b (corresponding to a resistor having an infinitely large value). For cost reasons, the open terminal b is preferably used for the variant and/or for the class (e.g., class K7) that is installed most frequently. Defined electric states in the form of current/voltage combinations, for example, are necessary to differentiate these three electric circuits.

The electric state is detected by the analyzer unit 22 and compared with stored data. According to the present variant of the subassembly and/or actuator device 1*b*, which is recognized by the analyzer unit 22, a corresponding control of the subassembly and/or actuator device 1*b* is preferably performed by means of engine characteristics maps preferably stored in the control unit for control of the subassembly and/or stored in the additional control unit 10.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A system for a motor vehicle for characterizing one of multiple variants of an electrically controllable subassembly, the system comprising:

a coding plug connectable to the subassembly; and an analyzer unit with a measurement input connectable directly or indirectly to at least one electric terminal of the coding plug, wherein the coding plug has a fixed electric wiring arranged such that a defined electric state is generable at the measurement input of the analyzer unit, wherein the electric state is detected by the analyzer unit and compared with stored data such that the defined electric state differentiable from all other states is assigned to each possible variant of the subassembly, and wherein the electric wiring of the coding plug is an ohmic resistor having a defined value, said resistor being connectable to the terminal of the coding plug assigned to the measurement input of the analyzer circuit, and a resistance value differentiable from all other resistance values being assigned to each possible variant of the subassembly.

2. The system of claim 1, wherein the motor vehicle has four-wheel drive at least temporarily, an electronic control unit by means of which the drive torque of a drive unit is variably distributable to primary driving wheels which are permanently connected to the drive unit and to secondary driving wheels which are connectable on demand to the drive unit via a transmission clutch, wherein the control unit determines a setpoint clutch torque which is to be set by an actuator device on the transmission clutch, said control unit containing the analyzer unit and said actuator device being the electrically controllable subassembly.

3. The system as claimed in claim 1, wherein the coding plug is an adapter plug between the electric terminals of the subassembly and the electric terminals of the analyzer unit or an electronic control circuit containing the analyzer unit for controlling the subassembly.

4. The system as claimed in claim 1, wherein the coding plug is an adapter plug between the electric terminals of the subassembly and the electric terminals of the analyzer unit or an electronic control circuit containing the analyzer unit for controlling the subassembly.

5. The system as claimed in claim 1, wherein the coding plug is an adapter plug between the electric terminals of the subassembly and the terminals of a cable tree, which is connectable to the analyzer unit or to an electronic control unit containing the analyzer unit for controlling the subassembly.

6. The system as claimed in claim 1, wherein the coding plug is an adapter plug between the electric terminals of the subassembly and the terminals of a cable tree, which is connectable to the analyzer unit or to an electronic control unit containing the analyzer unit for controlling the subassembly.

7. The system as claimed in claim 3, wherein the coding plug is an adapter plug between the electric terminals of the subassembly and the terminals of a cable tree, which is connectable to the analyzer unit or to an electronic control unit containing the analyzer unit for controlling the subassembly.

8. The system as claimed in claim 1, wherein the coding plug is an extra plug which is attached by a mechanical connection to the subassembly and has at least one electric terminal which is connectable directly or indirectly by a cable or by a cable tree to the electric terminal of the analyzer unit assigned to the measurement input or to an electronic control unit containing the analyzer unit for controlling the subassembly.

9. A method for a motor vehicle for determining a variant of an electrically controllable subassembly, the method comprising the acts of:

connecting an analyzer unit with a measurement input to at least one electric terminal of a coding plug;

assigning a defined electric state differentiable from all other states to each possible variant of the subassembly;

detecting a generated defined electric state;

comparing the detected defined electric state with the assigned defined electric states to determine a variant of the subassembly; and providing electric wiring of the coding plug with an ohmic resistor having a defined value, said resistor being connectable to the terminal of the coding plug assigned to the measurement input of the analyzer circuit, and a resistance value differentiable from all other resistance values being assigned to each possible variant of the subassembly.

10. The method as claimed in claim 9, further comprising the acts of:

storing the assigned defined electric states.

11. The method as claimed in claim 9, wherein the motor vehicle has four-wheel drive at least temporarily, an electronic control unit by means of which the drive torque of a drive unit is variably distributable to primary driving wheels which are permanently connected to the drive unit and to secondary driving wheels which are connectable on demand to the drive unit via a transmission clutch, wherein the control unit determines a setpoint clutch torque which is to be set by an actuator device on the transmission clutch, said control unit containing the analyzer unit and said actuator device being the electrically controllable subassembly.

* * * * *